(12) United States Patent
Liao (10) Patent No.: US 8,963,217 B2
(45) Date of Patent: Feb. 24, 2015

(54) WAFER STRUCTURE AND POWER DEVICE USING THE SAME

(71) Applicant: Silergy Semiconductor Technology (Hangzhou) Ltd, Hangzhou (CN)

(72) Inventor: Zhongping Liao, Hangzhou (CN)

(73) Assignee: Silergy Semiconductor Technology (Hangzhou) Ltd, Hangzhou (CN)

( * ) Notice: Subject to any disclaimer, the term of this patent is extended or adjusted under 35 U.S.C. 154(b) by 0 days.

(21) Appl. No.: 14/170,764

(22) Filed: Feb. 3, 2014

(65) Prior Publication Data

US 2014/0252554 A1 Sep. 11, 2014

(30) Foreign Application Priority Data

Mar. 5, 2013 (CN) .......................... 2013 1 0069739

(51) Int. Cl.
| | |
|---|---|
| *H01L 29/80* | (2006.01) |
| *H01L 29/76* | (2006.01) |
| *H01L 21/336* | (2006.01) |
| *H01L 29/36* | (2006.01) |
| *H01L 29/66* | (2006.01) |

(52) U.S. Cl.
CPC .......... *H01L 29/36* (2013.01); *H01L 29/66666* (2013.01)
USPC ........... 257/262; 257/263; 257/328; 257/329; 438/268; 438/336

(58) Field of Classification Search
USPC .......................... 257/262, 263, 328, 329, 335; 438/268–272, 316, 336
See application file for complete search history.

(56) References Cited

U.S. PATENT DOCUMENTS

| | | | |
|---|---|---|---|
| 5,637,898 A * | 6/1997 | Baliga | ........................... 257/330 |
| 6,476,442 B1 | 11/2002 | Williams et al. | |
| 7,772,668 B2 | 8/2010 | Pan | |
| 8,574,962 B2 | 11/2013 | Nakata et al. | |
| 8,779,509 B2 | 7/2014 | Schulze et al. | |
| 2006/0071295 A1 | 4/2006 | Chang | |
| 2010/0301410 A1* | 12/2010 | Hirler | ........................... 257/334 |
| 2011/0018005 A1* | 1/2011 | Nakano | ........................... 257/77 |
| 2012/0168819 A1* | 7/2012 | Marino et al. | ................. 257/192 |
| 2013/0196457 A1 | 8/2013 | Nakajima et al. | |
| 2013/0217185 A1 | 8/2013 | Wisotzki et al. | |
| 2014/0231912 A1 | 8/2014 | Willmeroth et al. | |

* cited by examiner

Primary Examiner — Hsien Ming Lee
(74) Attorney, Agent, or Firm — Michael C. Stephens, Jr.

(57) ABSTRACT

In one embodiment, a wafer structure configured for a power device can include: (i) a first doping layer having a high doping concentration; (ii) a second doping layer on the first doping layer, where a doping concentration of the second doping layer is less than the high doping concentration; and (iii) a third doping layer on the second doping layer, where a doping concentration of the third doping layer is greater than the doping concentration of the second doping layer. For example, the power device can be part of a switching voltage regulator.

18 Claims, 8 Drawing Sheets

WAFER STRUCTURE AND POWER DEVICE USING THE SAME

RELATED APPLICATIONS

This application claims the benefit of Chinese Patent Application No. 201310069739.3, filed on Mar. 5, 2013, which is incorporated herein by reference in its entirety.

FIELD OF THE INVENTION

The present invention relates to the field of semiconductor devices, and more particularly to a wafer structure and power devices fabricated in the wafer structure.

BACKGROUND

A switched-mode power supply (SMPS), or a "switching" power supply or voltage regulator, can include a power stage circuit and a control circuit. The power stage circuit can include one or more power devices. When an input voltage is applied, the control circuit can consider internal parameters and external load changes, and may regulate the on/off times of the switch system in the power stage circuit. In this way, the output voltage and/or the output current of the switching power supply can be maintained as substantially constant. Elements in the power stage circuit and/or control circuit can be fabricated in a semiconductor wafer.

SUMMARY

In one embodiment, a wafer structure configured for a power device can include: (i) a first doping layer having a high doping concentration; (ii) a second doping layer on the first doping layer, where a doping concentration of the second doping layer is less than the high doping concentration; and (iii) a third doping layer on the second doping layer, where a doping concentration of the third doping layer is greater than the doping concentration of the second doping layer. For example, the power device can be part of a switching voltage regulator.

In one embodiment, a method of making a VDMOS transistor in a wafer can include: (i) forming a first doping layer having a high doping concentration; (ii) forming a second doping layer on the first doping layer, wherein a doping concentration of the second doping layer is less than a doping concentration of the first doping layer, and the first and second doping layers and a same dopant type; (iii) forming a third doping layer on the second doping layer, where a doping concentration of the third doping layer is greater than the doping concentration of the second doping layer; (iv) forming p-type regions in the third doping layer; (v) forming n-type source regions in the p-type regions; (vi) forming polysilicon gates between the p-type regions and above the third doping layer; and (vii) forming a metal layer for connection to the n-type source regions.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
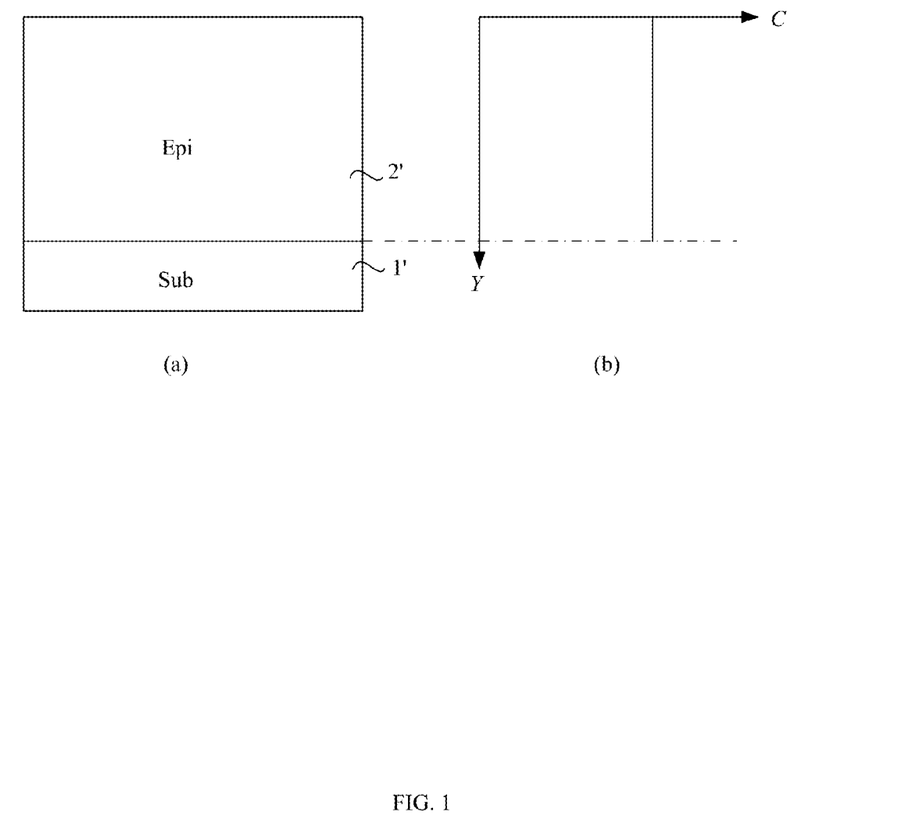
FIG. 1 is a diagram of an epitaxial structure and doping concentration distribution in a wafer structure.

In manufacturing power devices (e.g., for switching voltage regulators), one semiconductor wafer structure may include a high resistance layer (e.g., an epitaxial layer) extending from a relatively low resistance semiconductor substrate. Such a structure may tolerate relatively high voltages, and thus be suitable for power devices and/or circuitry. Further, the low resistance substrate, as a support, may not add undesirable or substantial resistance to the power device or overall structure. FIG. 1 shows a diagram of an example epitaxial structure and doping concentration distribution in a wafer structure.

As shown in diagram (a) of FIG. 1, a wafer structure can include semiconductor substrate 1' and single-layered and uniformly doped epitaxial layer 2'. As shown in diagram (b) of FIG. 1, abscissa C may denote the doping concentration spanning across doping layer 2', and ordinate Y can denote the longitude depth, of doped epitaxial layer 2'. However, drawbacks of this structure can include relatively high conduction resistance and saturation voltage drop for a power device fabricated in such a wafer structure.

For a vertical double diffused metal oxide semiconductor (VDMOS) field-effect transistor type of power device, breakdown voltage and conduction resistance can be important parameters. Typically, the breakdown voltage of the power device may need to be as high as possible, while the conduction resistance should be as low as possible. Therefore, during manufacturing or fabrication of a VDMOS device, the value of conduction resistance ($R_{dson}$) should be considered.

Figure 2:
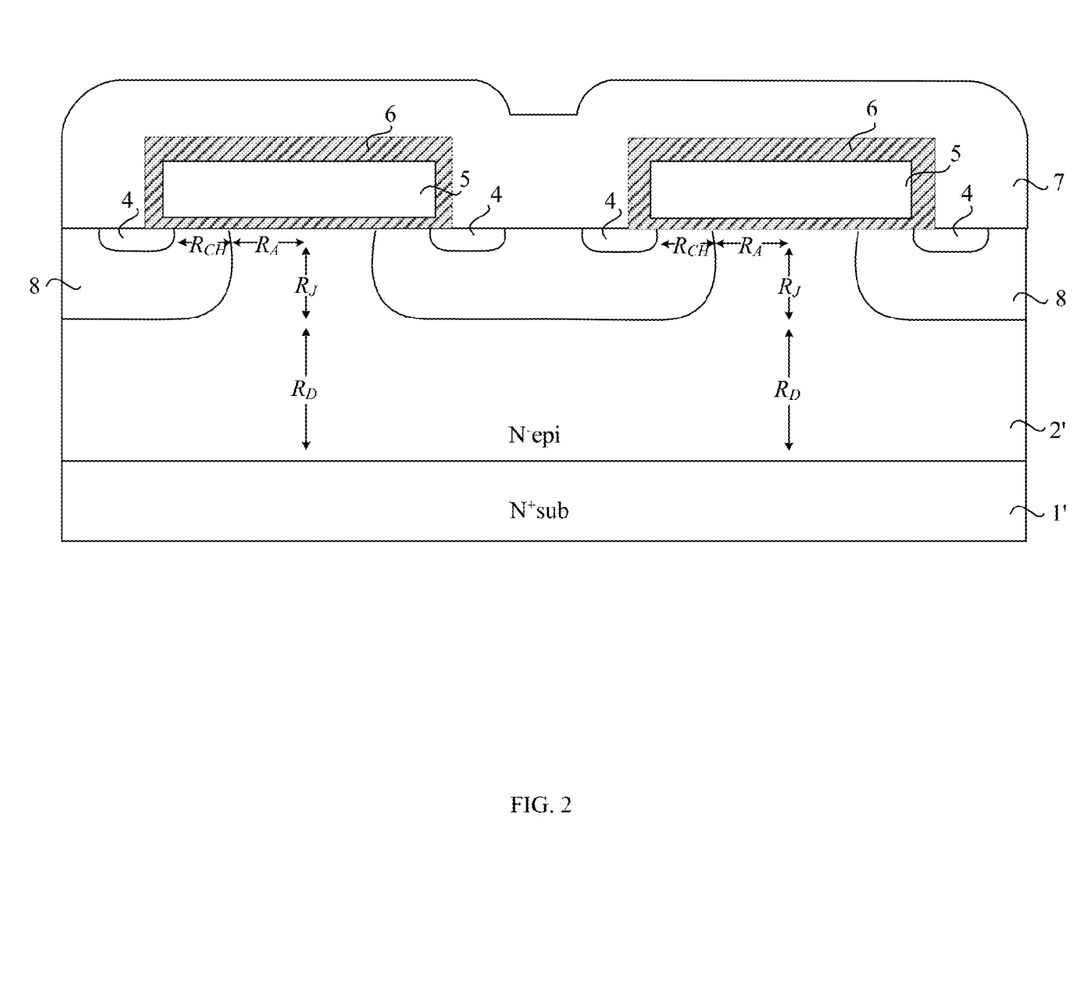
FIG. 2 is a cross-sectional diagram of a wafer structure applied for a VDMOS transistor.

Referring now to FIG. 2, shown is a cross-sectional diagram of a wafer structure applied for a VDMOS transistor. For example, a drain contact can be placed under the device at the N+sub, and a source contact can be placed over source region 4. In this example structure, the active region of the VDMOS can be formed on uniformly doped epitaxial layer 2'. Also, the conduction resistance of the VDMOS can include portions of channel resistance $R_{CH}$, accumulation layer resistance $R_A$, JFET resistance $R_J$, and diffused resistance $R_D$. For example, JFET resistance $R_J$ can occupy the largest ratio (e.g., greater than about 50%) of the total VDMOS conduction resistance, particularly for a MOS transistor where the "withstand" or breakdown voltage is less than about 100 V. Thus it JFET resistance $R_J$ is not optimized or reduced, it may be difficult to sufficiently reduce the conduction resistance of the VDMOS device.

In one embodiment, a wafer structure configured for a power device can include: (i) a first doping layer having a high doping concentration; (ii) a second doping layer on the first doping layer, where a doping concentration of the second doping layer is less than the high doping concentration; and (iii) a third doping layer on the second doping layer, where a doping concentration of the third doping layer is greater than the doping concentration of the second doping layer. For example, the power device can be part of a switching voltage regulator.

Figure 3:
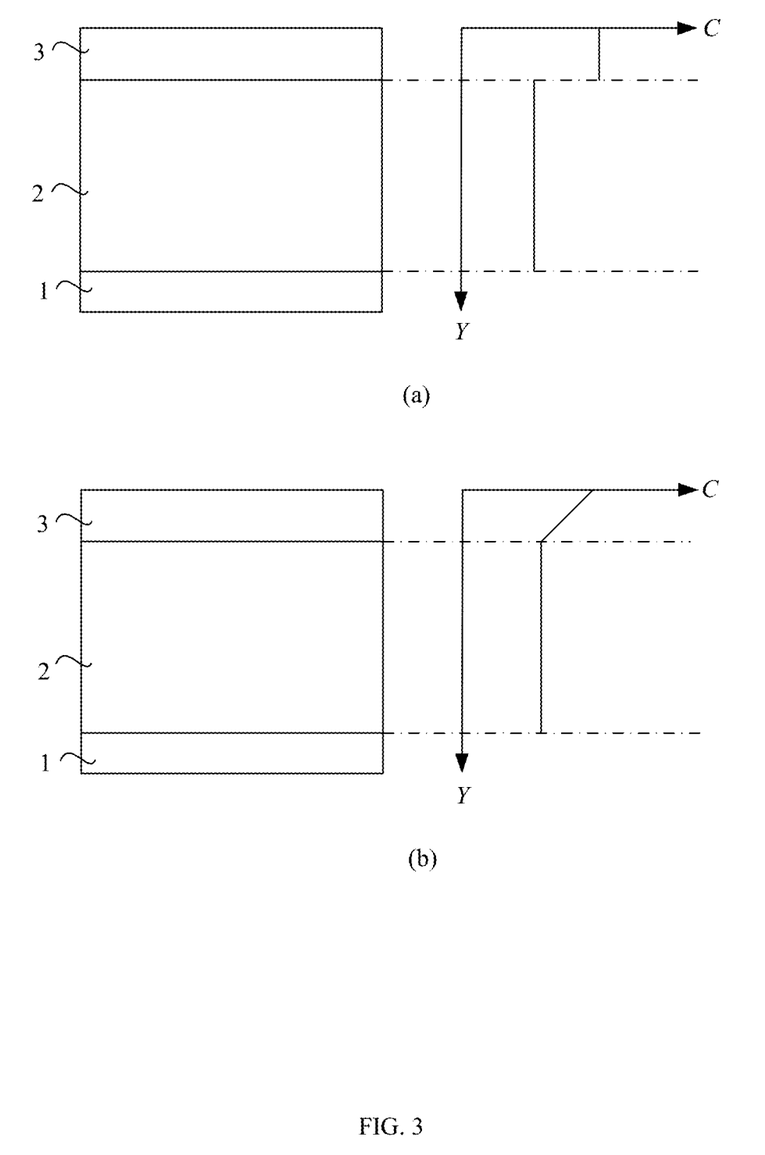
FIG. 3 is a diagram of a wafer structure with an example doping concentration distribution, in accordance with embodiments of the present invention.

Referring now to FIG. 3, shown is a diagram of a wafer structure with example doping concentration distributions, in accordance with embodiments of the present invention. This particular example can include doping layer 1, doping layer 2, and doping layer 3, which may be formed in sequence. For example, doping layer 1 can include a relatively high concentration doping (e.g., n+ or p+), and doping layer 2 may include a relatively low concentration doping (e.g., n– or p–). In some cases, doping layer 2 may have another or predetermined doping concentration, which can still be less than that of doping layer 1.

The doping concentration of doping layer 3 can be greater than that of doping layer 2. Also, different distributions or profiles of doping concentrations, such as for doping layers 2 and/or 3, can be supported in particular embodiments. For example, the doping concentration of doping layer 2 may be distributed uniformly as shown in diagram (a) of FIG. 3, as indicated by a straight vertical line through the dimensions of doping layer 2 in the doping concentration profile.

The doping concentration of doping layer 3 may also be distributed uniformly, as shown in diagram (a) of FIG. 3. Alternatively, the doping concentration of doping layer 3 may be changed continuously and/or gradiently, as shown in diagram (b) of FIG. 3, and as indicated by the sloped lines in the example doping concentration profiles through the dimensions of doping layer 3. Also for example, the thickness of doping layer 2 can be greater than the thickness of doping layer 3. In some cases, the thickness of doping layer 2 can be substantially thicker than (e.g., 4-5 times, or 10 times, as thick as) that of doping layer 3.

Doping layer 1 can be utilized as the substrate of the semiconductor, and doping layer 2 can be formed thereon by epitaxial growth. Doping layer 3 can also be formed on doping layer 2 via epitaxial growth. Alternatively, doping layer 3 can be formed on doping layer 2 by ion injection at the surface of doping layer 2. Also, doping layers 2 and 3 can be utilized or formed as a single epitaxial layer. In any case, the basic materials can remain consistent or common among different configurations. For example, the semiconductor substrate (e.g., doping layer 1) can be silicon that is heavily-doped with arsenic or phosphorus, doping layer 2 can be silicon epitaxy with lightly-doped phosphorus, and doping layer 3 can also be silicon epitaxy with a different (e.g., higher) doping concentration than that of doping layer 2.

Certain embodiments can also provide a power device (e.g., a power transistor) that utilises or is fabricated in a wafer structure as described herein. In particular, an active region for the power device can be formed in the wafer structure. Any such power device (e.g., a metal oxide semiconductor field-effect transistor [MOSFET], an insulated gate bipolar transistor [IGBT], a VDMOS transistor, a diode, etc.) can be employed in particular embodiments, and may be included in a switching voltage regulator or switched-mode power supply (SMPS). As will be described below, vertical double diffused metal oxide semiconductor field-effect (VDMOS) transistors and IGBT power devices will be used as examples to describe the wafer structure and advantages of the power device formed therein.

Figure 4:
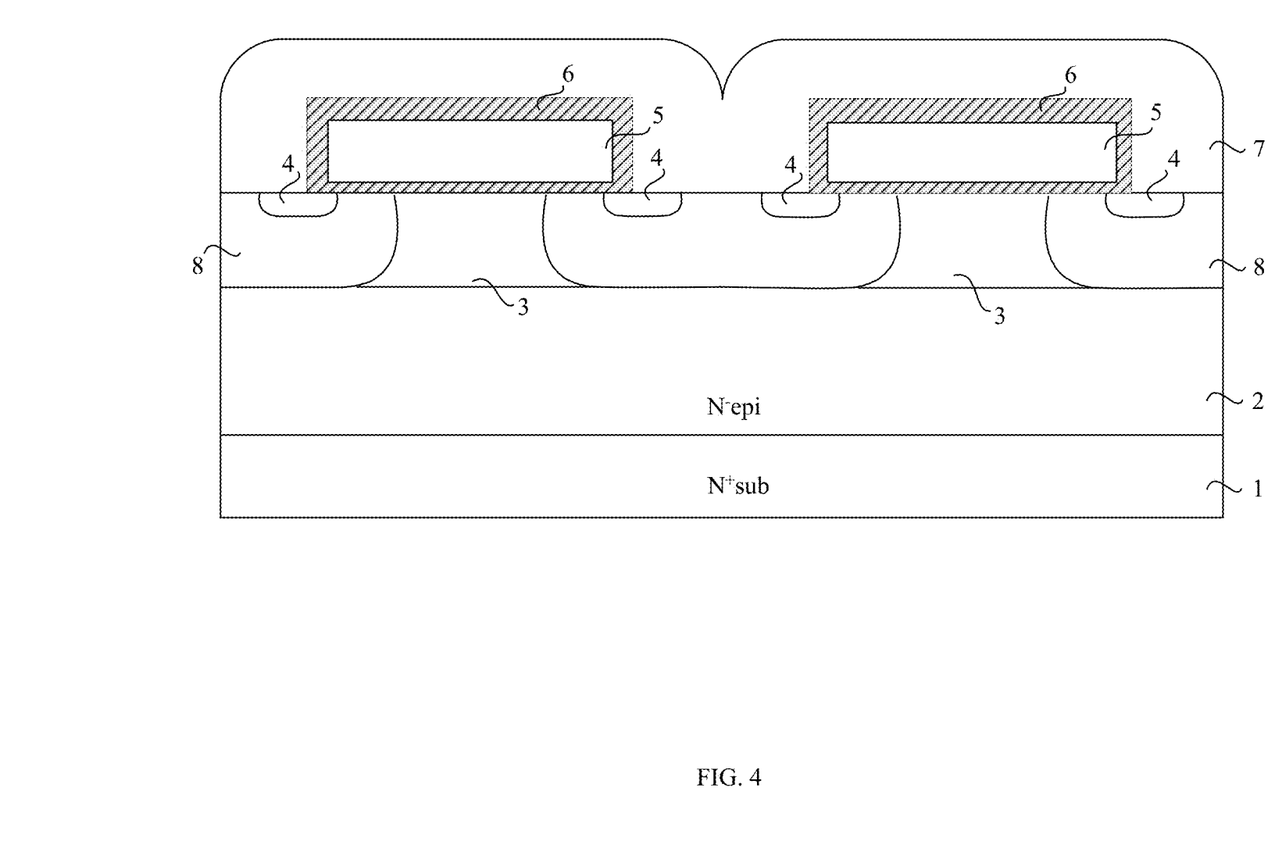
FIG. 4 is a cross-sectional diagram of a wafer structure applied for a VDMOS transistor, in accordance with embodiments of the present invention.

Referring now to FIG. 4, shown is a cross-sectional diagram of a wafer structure applied for a VDMOS transistor type of power device, in accordance with embodiments of the present invention. For example, doping layer 1 can be an n-type heavily doped silicon substrate, and doping layer 2 can be n-type material with relatively light doping. Also, the doping concentration of doping layer 2 can be uniformly distributed in this particular example. Further, doping layer 3 can be on doping layer 2, and the doping concentration of doping layer 3 can be greater than that of doping layer 2.

In particular embodiments, the type of the impurity (e.g., n-type or p-type) of doping layer 2 may be the same type of the impurity (e.g., both n-type, or both p-type) as that of doping layer 1. Alternatively, the impurity types of doping layers 1 and 2 may be opposite types (e.g., n-type for one layer, and p-type for another layer). For example, when the doping type of doping layer 2 is n-type, the corresponding doping type of doping layer 1 can be n+ doping or p+ doping. In some cases, the particular doping types and/or arrangements may depend on specific requirements or specifications of the power device being fabricated in the wafer structure.

Source region (e.g., n+ type) 4 can be formed in well or doped (e.g., p-type) region 8. Gate 5 (e.g., polysilicon) can be formed above doping layer 3, and may extend from one p-type region 8 to another. Oxide layer 6 can include a thin oxide layer under polysilicon gate 5, as well as sidewall and topside oxide surrounding and insulating polysilicon gate 5 over the active region of the power device. Metal (e.g., aluminum) layer 7 can be formed to provide connectivity, e.g., to one or more source regions 4 of the power device.

In this particular arrangement, the JFET resistance (e.g., $R_J$) of the portion between p-type regions 8 can be substantially reduced as compared to other wafer structures, due to the relatively high doping concentration of doping layer 3. In this way, the conduction resistance of the VDMOS device can be reduced, as compared to such other wafer structures. Further, the increased doping concentration of doping layer 3 may not lead to a significant drop in the breakdown voltage of the VDMOS device. In fact, the drop in conduction resistance may be more apparent for VDMOS devices having a breakdown voltage of less than about 100 V.

Figure 5A:
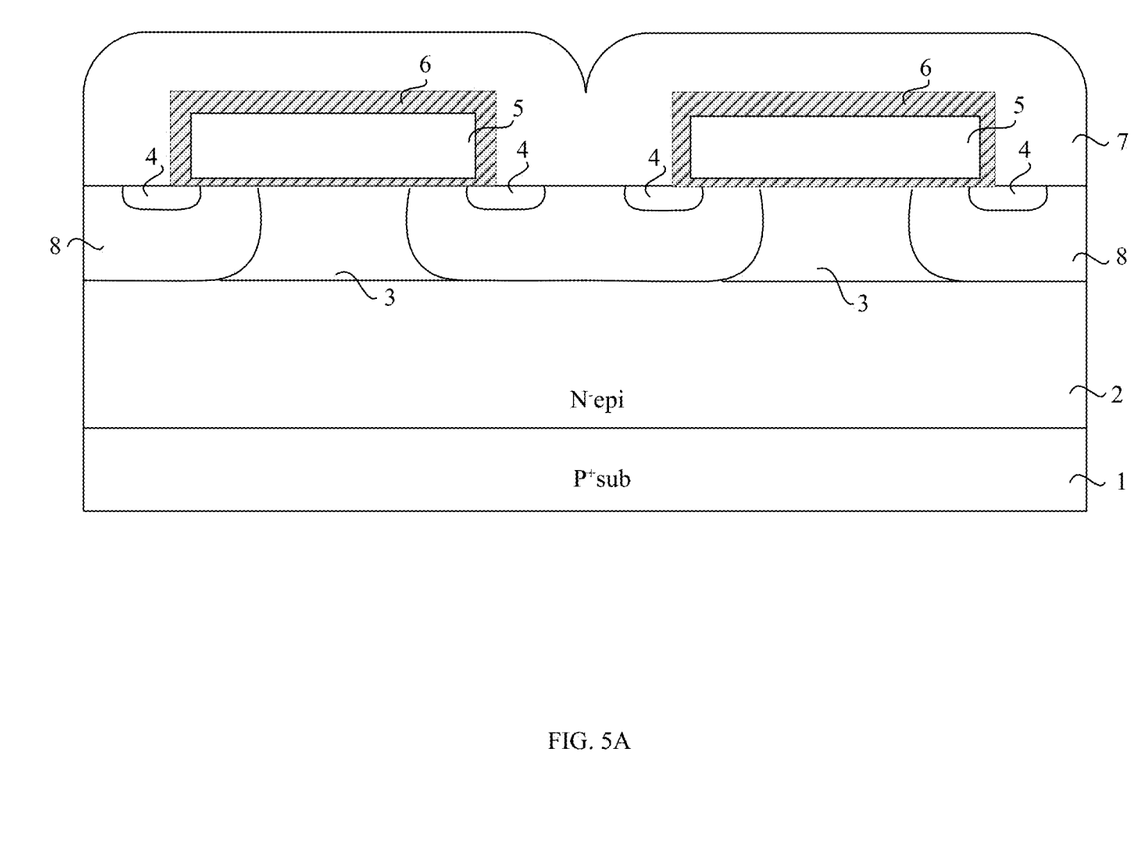
FIG. 5A is a first cross-sectional diagram of a wafer structure applied for IGBT device, in accordance with embodiments of the present invention.
Figure 5B:
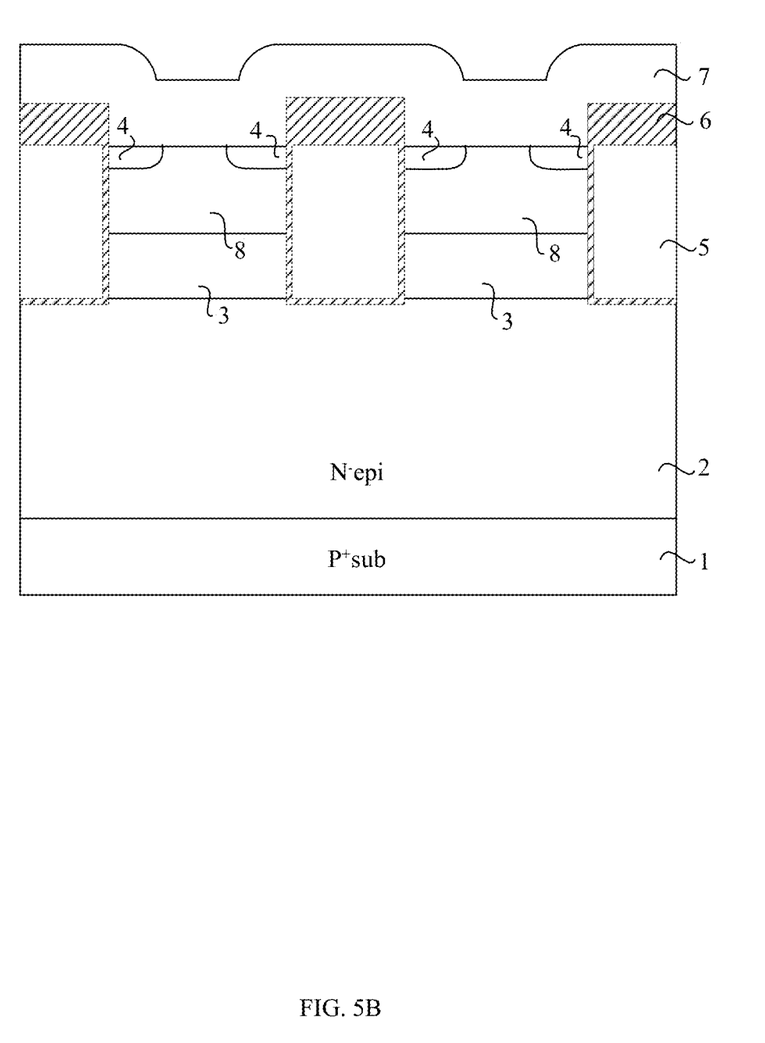
FIG. 5B is a second cross-sectional diagram of a wafer structure applied for IGBT device, in accordance with embodiments of the present invention.

Referring now to FIGS. 5A and 5B, shown are cross-sectional diagrams of a wafer structure applied for IGBT power device, in accordance with embodiments of the present invention. In this example, doping layer 1 can be a p-type heavily doped silicon substrate. Because doping layer 3 resides between p-type regions 8, carriers injected from the collector clusters under p-type regions 8, and the hole density of the emitter side can be adjusted to form a high hole density barrier. In this way, the saturation voltage drop $V_{CE(sat)}$ of the IGBT device can be reduced, as compared to such devices in other wafer structures.

Figure 6:
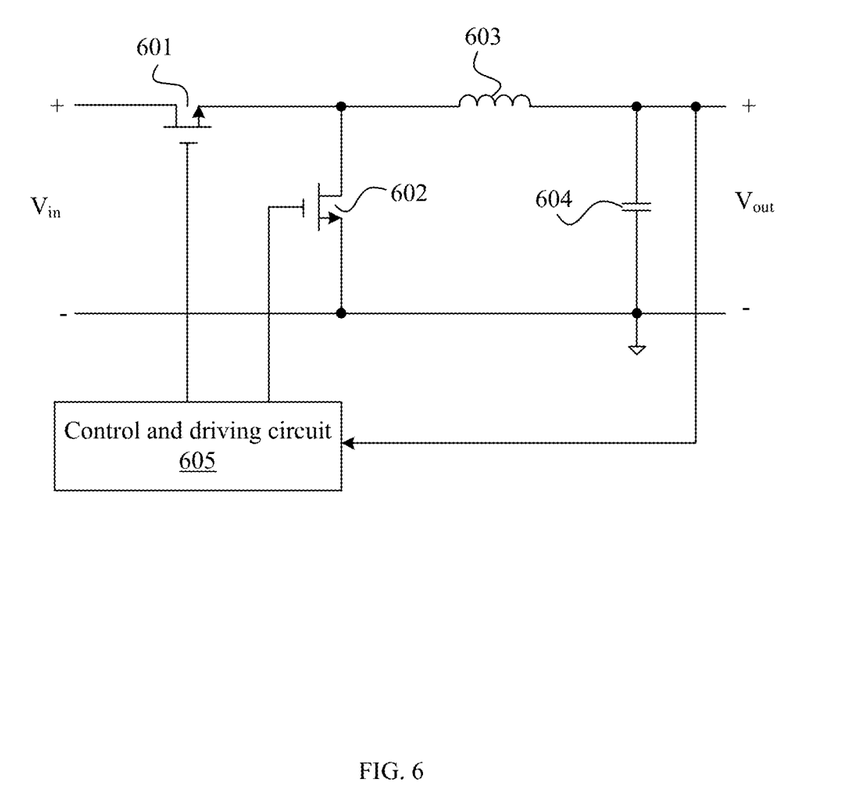
FIG. 6 is a schematic diagram of an example synchronous switching voltage regulator, in accordance with embodiments of the present invention.

Referring now to FIG. 6, shown is a schematic diagram of an example switching voltage regulator that includes power devices as described herein. A switching voltage regulator is just one example of the circuitry that can be wholly or partially fabricated in the wafer structure of particular embodiments. In this example, power transistors 601 and 602, inductor 603, and capacitor 604 can form a synchronous buck power stage circuit. In other cases, other types of power stage or converter circuits (e.g., flyback, SEPIC, boost, buck-boost, etc.) can be formed. Control and driving circuit 605 (e.g., including a pulse-width modulation [PWM] controller) can receive an output signal of the power stage circuit, to form a closed-loop feedback control loop to control the switching state of power transistors 601 and 602. In this way, the output signal of the power stage circuit can be controlled to be substantially constant.

Of course, other integration or grouping of circuitry into different chips, ICs, or wafers can be accommodated in particular embodiments. In one example, a multi-chip packaging structure in particular embodiments can include power transistors 601 and 602 being integrated into a power device chip, and control and driving circuit 605 being integrated into a control chip. Since the power device may process a high voltage and/or a high current, the power device chip with a large area can be able to withstand a relatively high voltage and a relatively high current. Also, the power device may have good thermal characteristics for power supply integration.

For the integrated circuit of the switching voltage regulator shown in FIG. 6, if the carrying capacity of power transistor 602 is greater than that of power transistor 601, power transistor 602 may be much larger than power transistor 601. Thus, power transistor 602 (e.g., the synchronous power device) can be integrated in a single synchronous power device chip, and power transistor 601 (e.g., the main power device) as well as control and driving circuit 605 can be integrated in another single mixed chip. Further, power transistors 601 and/or 602 can be any suitable types of transistors or devices (e.g., super-junction MOS transistors, VDMOS, LDMOS, IGBT, etc.)

In one embodiment, a method of making a VDMOS transistor in a wafer can include: (i) forming a first doping layer having a high doping concentration; (ii) forming a second doping layer on the first doping layer, wherein a doping concentration of the second doping layer is less than a doping concentration of the first doping layer, and the first and second doping layers and a same dopant type; (iii) forming a third doping layer on the second doping layer, where a doping concentration of the third doping layer is greater than the doping concentration of the second doping layer; (iv) forming p-type regions in the third doping layer; (v) forming n-type source regions in the p-type regions; (vi) forming polysilicon gates between the p-type regions and above the third doping layer; and (vii) forming a metal layer for connection to the n-type source regions.

Figure 7:
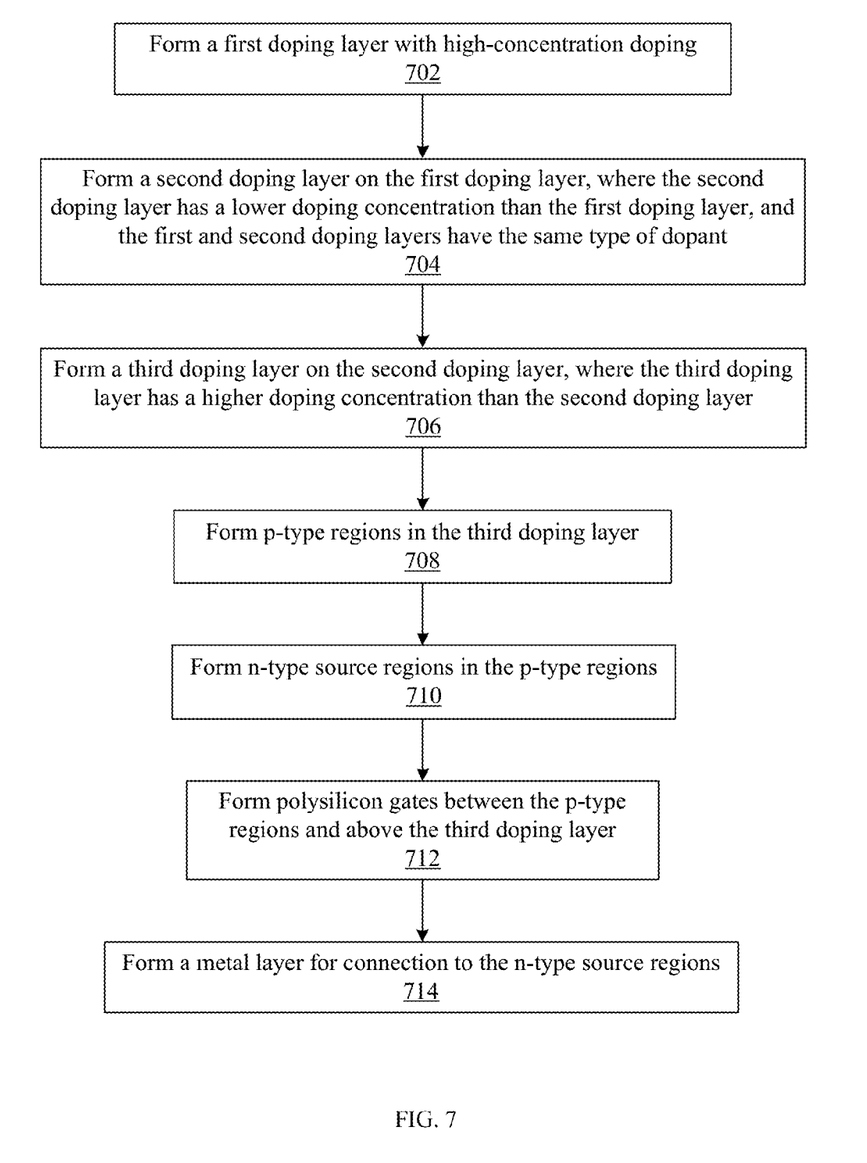
FIG. 7 is a flow diagram of an example method of making a transistor in a wafer structure in accordance with embodiments of the present invention.

Referring now to FIG. 7, shown is a flow diagram of an example method of making a transistor in a wafer structure in accordance with embodiments of the present invention. For example, this particular method can make a structure for a VDMOS transistor power device, as shown above in FIG. 4. At 702, a first doping layer with high concentration doping can be formed. For example, n-type impurities can be heavily doped into a silicon substrate to form the first doping layer (e.g., N+sub).

At 704, a second doping layer can be formed on the first doping layer. For example, n-type impurities can be lightly doped to form an N-epi layer. The doping concentration of the second doping layer can be less than that of the first doping layer, and the doping concentration in this second layer can be uniformly distributed. At 906, a third doping layer can be formed on the second doping layer. For example, the third doping layer can have a doping concentration that is greater than that of the second doping layer. The third doping layer can have a doping concentration that is uniformly distributed therein (see, e.g., diagram (a) of FIG. 3). Alternatively, the third doping layer can have a doping concentration that is gradiently distributed (see, e.g., diagram (b) of FIG. 3). Also, the second doping layer can have a thickness greater than that of the third doping layer.

At 708, p-type regions (e.g., well regions) can be formed in the third doping layer. At 710, n-type source regions can be formed in the p-type regions. At 712, polysilicon gates can be formed between the p-type regions and above the third doping layer. At 714, a metal layer (e.g., aluminum) can be formed for connection to the n-type source regions. In addition, an oxide layer (e.g., a thin oxide layer underneath) can be formed to at least partially surround the polysilicon gate layer. Further, a field oxide (FOX) layer can be grown or deposited on the surface of the device to provide isolation, and the metal layer can be deposited on the field oxide layer. Further, the metal layer can be used to form connections (e.g., to one or more source regions, such as by way of vias and/or contacts. In this way, connections between the transistor structure (e.g., at a source terminal) and one or more other circuits fabricated on the wafer can be made.

The embodiments were chosen and described in order to best explain the principles of the invention and its practical applications, to thereby enable others skilled in the art to best utilize the invention and various embodiments with modifications as are suited to the particular use contemplated. It is intended that the scope of the invention be defined by the claims appended hereto and their equivalents.

What is claimed is:

1. A wafer structure configured for a power device, the wafer structure comprising:
   a) a first doping layer having a high doping concentration;
   b) a second doping layer on said first doping layer, wherein a doping concentration of said second doping layer is less than a doping concentration of said first doping layer, and wherein said first and second doping layers have a same dopant type;
   c) a third doping layer on said second doping layer, wherein a doping concentration of said third doping layer is greater than said doping concentration of said second doping layer;
   d) p-type regions in said third doping layer;
   e) n-type source regions in said p-type regions;
   f) polysilicon gates between said p-type regions and above said third doping layer; and
   g) a metal layer for connection to said n-type source regions.

2. The wafer structure of claim 1, wherein said second doping layer is formed by epitaxial growth on said first doping layer.

3. The wafer structure of claim 1, wherein said third doping layer is formed by epitaxial growth on said second doping layer.

4. The wafer structure of claim 1, wherein said third doping layer is formed by ion injection into a surface of said second doping layer.

5. The wafer structure of claim 1, wherein said first doping layer, said second doping layer, and said third doping layer each have a same dopant material.

6. The wafer structure of claim 1, wherein said doping concentration of said second doping layer is uniformly distributed.

7. The wafer structure of claim 1, wherein said doping concentration of said third doping layer is uniformly distributed.

8. The wafer structure of claim 1, wherein said doping concentration of said third doping layer is gradiently distributed.

9. A switching voltage regulator, comprising:
   a) said wafer structure of claim 1; and
   b) said power device formed in said wafer structure.

10. The switching voltage regulator of claim 9, wherein said power device comprises a metal oxide semiconductor field-effect transistor (MOSFET).

11. The switching voltage regulator of claim 10, wherein said MOSFET comprises a longitude super-junction metal oxide field-effect transistor or a vertical double diffused metal oxide semiconductor field-effect transistor (VDMOS).

12. The switching voltage regulator of claim 9, wherein said power device comprises an insulated gate bipolar transistor (IGBT).

13. The switching voltage regulator of claim 9, wherein said power device comprises a diode.

14. A method of making a VDMOS transistor in a wafer, the method comprising:
   a) forming a first doping layer having a high doping concentration;
   b) forming a second doping layer on said first doping layer, wherein a doping concentration of said second doping layer is less than a doping concentration of said first doping layer, and wherein said first and second doping layers have a same dopant type;
   c) forming a third doping layer on said second doping layer, wherein a doping concentration of said third doping layer is greater than said doping concentration of said second doping layer;
   d) forming p-type regions in said third doping layer;
   e) forming n-type source regions in said p-type regions;
   f) forming polysilicon gates between said p-type regions and above said third doping layer; and
   g) forming a metal layer for connection to said n-type source regions.

15. The method of claim 14, wherein said forming said first doping layer comprises heavily doping a silicon substrate with n-type impurities.

16. The method of claim 14, wherein said forming said second doping layer comprises lightly doping said second doping layer with n-type impurities.

17. The method of claim 14, further comprising forming a thin an oxide layer prior to forming said polysilicon gates.

18. The method of claim 14, further comprising forming an oxide layer on said polysilicon gates.

* * * * *